May 19, 1970

A. B. TURNER ET AL

PbTe + Cr THERMOELECTRIC MATERIAL AND THERMOELECTRIC DEVICE

Original Filed Feb. 28, 1963

Re. 26,886

WITNESSES:

Bernard R. Gieguey

Raymond F. Majeski

INENTORS

Richard D. Lamb and Abner B. Turner.

BY C. L. Menzemer

ATTORNEY

United States Patent Office

Re. 26,886
Reissued May 19, 1970

26,886
PbTe+Cr THERMOELECTRIC MATERIAL AND THERMOELECTRIC DEVICE

Abner B. Turner, Greensburg, Pa., and Richard D. Lamb, Neosho, Mo., assignors to Westinghouse Electric Corporation, Pittsburgh, Pa., a corporation of Pennsylvania Original No. 3,321,336, dated May 23, 1967, Ser. No. 261,780, Feb. 28, 1963. Application for reissue Sept. 12, 1968, Ser. No. 765,708
Int. Cl. H01v *1/15*
U.S. Cl. 136—238 8 Claims

Matter enclosed in heavy brackets [ ] appears in the original patent but forms no part of this reissue specification; matter printed in italics indicates the additions made by reissue.

*ABSTRACT OF THE DISCLOSURE*

*This disclosure relates to chromium-doped lead telluride thermoelectric material having the formula PbTe+Cr wherein lead comprises from 60 to 63 weight percent and chromium 0.1 to 1.0% by weight of the lead telluride composition.*

The present invention relates to thermoelectric elements and thermoelectric devices embodying said elements. More particularly, the invention relates to an n-type thermoelectric material comprised of lead telluride doped with chromium.

Although the phenomena of thermoelectricity has been known for a considerable period of time and has been applied to cooling and heating purposes and electrical power generation, there has persisted a problem of obtaining suitable thermoelectric materials which will provide a substantially constant level of performance over extended period of use and thermocycling. Irrespective of the electrical and mechanical properties of the thermoelectric material, it is essential for some applications that the material retain a standard of efficiency, over extended usage. Many of the previously known thermoelectric materials which do combine the necessary electrical and mechanical properties were as a class found to be incapable of sustaining their level of performance over a period of usage.

A further shortcoming of some known thermoelectric materials is that when fabricated into elements or pellets and used in a thermoelectric device, such as, an electrical power generator, the elements or pellets would fail for mechanical reasons, owing to differences in transverse expansion through the length of the element or pellet as a result of the thermal gradient which is maintained between the ends of the element. When the thermoelectric device is used off and on, the one end of the element is expanded and contracted throughout a greater volume differential than is the other end and thereby causes physical structural failures because the materials lack cohesiveness in thermal shock resistance.

An object of the present invention is to provide a thermoelectric element comprised of lead telluride doped with chromium which will withstand repeated thermal stresses without failure.

Another object of the invention is to provide a thermoelectric device comprising at least one element comprised, at least in part, of chromium doped lead telluride.

Other objects of the invention will, in part, be obvious and will, in part, appear hereinafter.

Figure 1:
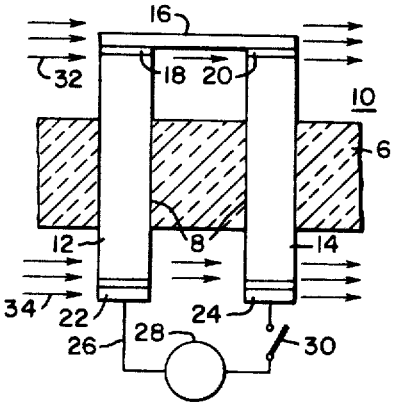
Figure 2:
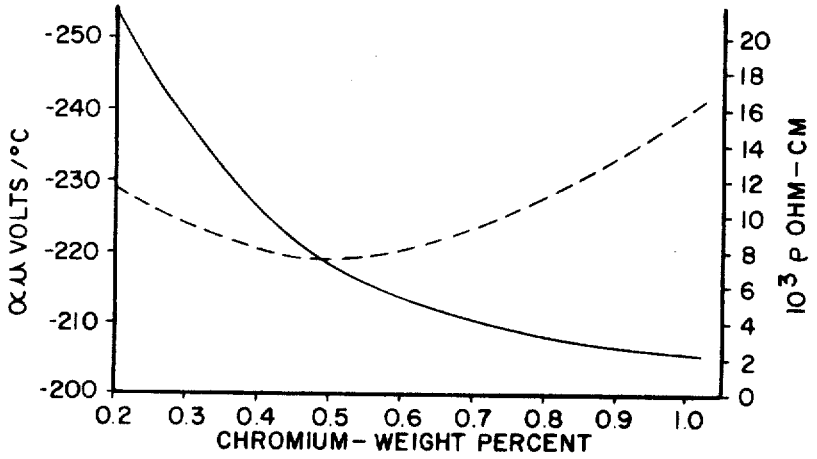
Figure 3:
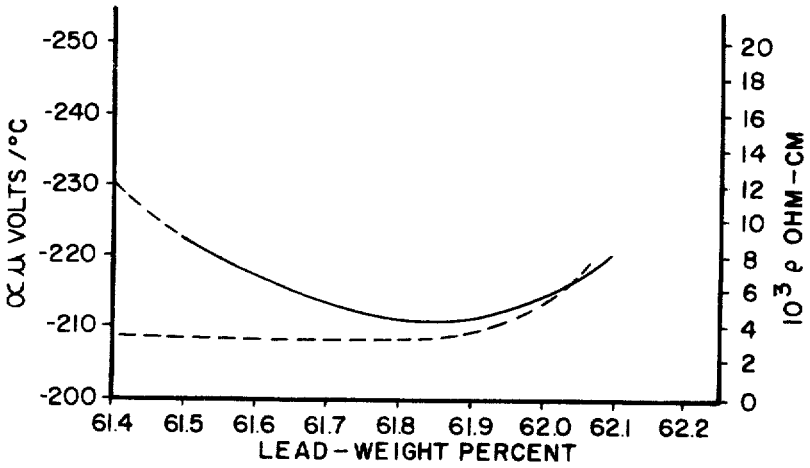

In order to more fully understand the nature and objects of the invention, reference should be had to the following detailed description and drawings, in which:

FIG. 1 is an elevation view, partly in cross section of a thermoelectric generator device embodying the present invention;

FIG. 2 is a graph setting forth the resistivity and Seebeck coefficient of chromium doped lead telluride compositions. The solid line curve illustrates the change in Seebeck coefficient with a change in the quantity of chromium and the dashed line curve illustrates change of resistivity with a change in the quantity of chromium present; and FIG. 3 illustrates in dashed line curves the change in resistivity of the element as a function of varying the lead concentration and in solid line curve the change in Seebeck coefficient as a function of varying the lead concentration in a lead tellurium alloy doped with chromium.

In accordance with the present invention and in attainment of the foregoing objects, there is provided a thermoelectric device comprising at least one thermoelectric element comprised of a chemically reacted solid composition having the formula [$Pb_xTe_{1-x}Cr$] *PbTe+Cr* wherein [X] *lead* [varies] *comprises* from [0.60] *60* to [0.63] *63 weight percent of the PbTe (lead telluride) composition.*

The factor establishing the upper limit of lead is dictated by the sintering temperature of the material which can cause separation of lead from the alloy when it is present in excess amounts. The lower limit is dictated by the amount of doping agent which is required to convert a tellurium rich alloy to an n-type material without a sacrifice of electrical or mechanical properties. In no event however, can the alloy become so tellurium rich that at the sintering temperature the alloy will become separated into discrete portions which are no longer homogeneous, or the thermoelectric power becomes positive. Best results are obtained with lead tellurium proportions wherein [X]*lead* [varies] *comprises* from about [0.610] *61* to [0.615] *61.5 weight percent of the lead telluride composition.*

In the present invention, the chromium in amounts of from about 0.1 to 1% by weight of the lead telluride composition serves as a surprisingly effective doping agent for reducing the resistance of the thermoelectric material but without substantially reducing the Seebeck coefficient. A further improvement is the improved electrical and mechanical endurance of the material. These factors are all correlated to provide an overall measure of efficiency of the thermoelectric material in accordance with the following relationship which applies to an evaluation of the present invention as well as to [preview] *previous* thermoelectric materials:

$$Z=\alpha^2\rho K$$

where:

Z=figure of merit
$\alpha$=Seebeck coefficient (microvolts per ° C.)
$\rho$=resistivity ($10^{-3}$ power ohm centimeters)
K=thermal conductivity (watt per centimeter ° C.).

The semiconductor composition of this invention may be formed into a solid body by casting or pressing a powder or a combination of both processes. The compositions are usually employed in a polycrystalline state which is the most easily achieved. However, single crystals may be prepared and are suitable for use in thermoelectric devices.

One particular advantage of the thermoelectric compositions of the present invention is that the thermoelectric characteristic is negative (n-type). These materials are opposite in sign to many of the other known thermoelectric materials having a high figure of merit. Consequently, the compositions of the present invention provide a desirable complement to those known positive (p-type) thermoelectric materials. For many purposes, a metal, such as copper and 18–8 stainless steel, may form the other element of the thermoelectric pair in which one element has the composition set forth herein. Also metallic, semi-metallic and non-metallic compounds may be employed, for example, zinc antimonide in stoichiometric proportions and p-type lead telluride.

One convenient method of preparing the chemically reacted composition of this invention suitable for use as an n-type thermoelectric material comprises admixing predetermined proportions of lead, tellurium, and chromium and charging the material within a quartz tube, sealed at one end. The tube with the materials contained therein, is then exhausted to about 25 to 30 inches vaccuum, and sealed. The tube is then placed in a rocking furnace and heated to a temperature of 1000 to 1050 C. After heating for about one hour, the material is water quenched or air quenched, removed from the glass, ground to a small particle size and compacted at about 15 to 40 tons per square inch to the shape of a thermoelectric pellet or element. The density of the element compact ranges from about 7.9 to about 8 grams per cubic centimeter. The density of the element effects the resistivity with the general relation being, densities below about 7.9 produced greater than optimum resistivity and densities greater than 8 tend to produce laminar cracks. The compact is then sintered for approximately three hours at about 600° C. to form the finished article.

A thermoelectric pellet which is prepared as described is characterized by a complete absence of separation, i.e., locations of non-uniform crystallographic distribution of lead or doping agent in the lead telluride lattice work.

Referring to FIG. 1 of the drawing, there is illustrated a thermoelectric device 10 suitable for generating electrical current by passing a hot gas or other source of heat over one junction thereof. An electrically insulating barrier 6 is provided with apertures 8 therein, through which are disposed the elements of the thermoelectric device. The device 10 comprises a positive thermoelectric element member 12, such as a bar of semi-metal, for example, zinc antimonide, and a negative element 14 comprised of pellets of the composition of this invention.

An electrically conducting strip 16 of a metal, for example, copper, silver and the like is joined to an end face 18 of the member 12 and an end face 20 of member 14 within the chamber formed by the barrier 6 so as to provide good electrical and thermal contact therewith. The end faces 18 and 20 may be coated with a thin layer of metal, for example, by vapor evaporation, ultrasonic brazing and flame spraying whereby good electrical contact and thermal adherence thereto is obtained. A metal strip 16 of copper, silver or the like, may be brazed or soldered to the metal coated end faces 18 and 20. The metal strip 16 may be provided with suitable fins or other means for conducting heat thereto from the chamber in which it is disposed.

At the end of member 12 located on the outer side of barrier walls 6 is attached a metal plate or strip 22 by brazing or soldering in the same manner as was employed in attaching strips 16 to the end face 18. Similarly, a metal strip or plate 24 may be connected to the other end of member 14. The plates 22 and 24 may be provided with heat dissipating fins or other cooling means whereby heat generated thereat may be dissipated. An electrical conductor 26 is affixed to the end plates 22 and 24 and connected to a work load 28. A switch 30 is interposed in the conductor 26 to enable the electrical current to be broken or closed as desired.

In operation, a hot gas or other fluid flowing as indicated by the arrows 32 heats the strip 16. Cooling means such as a stream of water or cold air, as indicated by arrows 34, flows over the strips 22 and 24 thereby maintaining these portions at a lower temperature than the portions 18 and 20. A direct electrical current is thereby generated proportional to the temperature difference. It will be appreciated that a plurality of pairs of thermoelectric elements may be joined in series, if desired, in order to produce a high potential or voltage. Consequently, direct current of any suitable voltage may be generated by connecting in series any number of paired elements. While the thermoelectric element 14 has been shown to be comprised entirely of a material having the composition [$Pb_xTe_{1-x}Cr$] $PbTe+Cr$ it will be understood that the material may comprise only a portion of the element, the remainder being comprised of one or more materials of the same thermoelectric sign. These materials may be joined end-to-end to form a composite pellet or joined to each other through metal end plates to form a single element.

In order to illustrate the invention more fully, the following examples are given:

EXAMPLE I

A thermoelectric element comprising the thermoelectric material of this invention was prepared by heating together within a rocking furnace a suitable quantity of material comprising 62.07 weight percent lead, 37.93 weight percent tellurium and 0.20 weight percent chromium at a temperature in excess of 1000° C. The materials was concurrently rocked back and forth in their liquid state to obtain an intimate mixing and dispersion of the materials. After about one hour of rocking and heating at a temperature of approximately 1050° C., the material was air quenched. The material was then crushed to about −50+325 mesh powder (U.S. standard sieve) and then pressed at 35 tons per square inch into pellets of ½ inch diameter and ¼ inch long at a density of about 8 grams per cubic centimeter. The thermoelectric body was then sintered for approximately 3 hours at about 600° C. to form the finished article.

The electrical properties of the element were detemined in terms of Seebeck coefficient and resistivity over a temperature range of 400° C. to 150° C. and the results are indicated in FIG. 2 for this thermoelectric composition.

EXAMPLE II

An n-type compound having the same lead tellurium proportion as Example I was doped with 0.50% by weight chromium and then formed into an n-type element in the manner previously described for Example I. Similar electrical tests were preformed on this element and the results obtained are indicated in FIG. 2.

EXAMPLE III

An n-type compound of the same lead tellurium ratio as the previous examples was doped with 1% by weight chromium and then formed into a thermoelectric pellet as previously described. Similar electrical tests were performed on this element and the results indicated in FIG. 2.

From the graph of FIG. 2, it will be seen that increased additions of chromium doping agent for a given ratio of lead tellurium has the effect of reducing the resistivity when the concentration by weight percent is increased from 0.2% to 0.5%, this being indicated by the dashed line curve plotting resistivity versus weight percent of chromium. The change of resistivity is accompanied also by a slight change in Seeback coefficient, this being shown by the solid line curve of FIG. 2 which plots Seeback coefficient versus weight percent chromium.

Referring next to FIG. 3, there is shown in solid line and dashed line curves the effect on Seebeck coefficient and resistivity of varying the proportion of lead in a lead tellurium pellet doped with 0.5% by weight chromium over a temperature range of 400° C. to 150° C. The curves embody the following example embodiments, all of which were made in accordance with the procedure of Example I.

EXAMPLE IV

| | Percent by weight |
|---|---|
| Lead | 61.88 |
| Tellurium | 38.12 |
| Chromium | 0.5 |

EXAMPLE V

| | Percent by weight |
|---|---|
| Lead | 61.50 |
| Tellurium | [38.12] *38.50* |
| Chromium | 0.5 |

Still referring to FIG. 2 and particularly to the solid line curve, it will be seen that the effect of adding increased amounts of lead is to reduce very slightly the Seebeck coefficient which is expressed in microvolts per degree centigrade. This reduction of Seebeck coefficient, however, reduces the figure of merit very slightly since the resistivity remains constant with additions of lead up to about 61.9% by weight. It is apparent from the figure that the best results are obtainable with lead varying between about 61% to 61.5% by weight of the composition and having 0.5% by weight chromium doping agent since the Seebeck coefficient reduces very slightly.

Although the present invention has been illustrated and described in connection with certain selected example embodiments of the composition and process, it will be understood that these are illustrative of the invention and are in no sense restrictive thereof. It is reasonable to presume that those skilled in the art can make numerous changes in both the composition and process and it is intended that such revisions which incorporate the herein disclosed principles will be included within the scope of the following claims as equivalents of the invention.

We claim as our invention:

1. A thermoelectric device comprising at least one thermoelectric element comprised at least in part of a chemically reacted solid having the formula [$Pb_xTe_{1-x}Cr$] *PbTe+Cr* as a dopant wherein [X varies] *lead is* from [0.60] *60* to [0.63] *63 weight percent of the lead telluride composition.*

2. A thermoelectric device comprising at least one element comprised at least in part of a solid having the formula [$Pb_xTe_{1-x}Cr$] *PbTe+Cr* wherein [X varies] *lead is* from [0.60] *60* to [0.63] *63 weight percent of the lead telluride composition* and chromium is present in an amount not substantially less than 0.1% by weight of the *lead telluride* composition.

3. A thermoelectric device comprising at least one element comprised at least in part of a solid having the formula [$Pb_xTe_{1-x}Cr$] *PbTe+Cr* wherein [X varies] *lead is* from [0.60] *60* to [0.63] *63 weight percent of the lead telluride composition* and chromium is present in amounts from 0.1% to 1% by weight of the *lead telluride* composition.

4. A thermoelectric device comprising at least one member comprised of a chemically reacted solid having the formula [$Pb_xTe_{1-x}Cr$] *PbTe+Cr* wherein [X varies] *lead is* from [0.61] *61* to [0.62] *62 weight percent of the lead telluride composition* and chromium is present in amounts from 0.4% to 0.6% by keight of the *lead telluride* composition.

5. A thermoelectric device comprising at least one member comprised of a chemically reacted solid having the formula [$Pb_xTe_{1-x}Cr$] *PbTe+Cr* wherein [X varies] *lead is* from [0.610] to [0.615] *61.5 weight percent of the lead telluride composition* and the chromium constituting about 0.50% by weight of the *lead telluride* composition.

6. A thermoelectric generator apparatus comprising an insulating wall, a thermoelectric device passing through the wall, the apparatus comprising at least one thermoelectric element comprised of a chemically reacted solid having the formula [$Pb_xTe_{1-x}Cr$] *PbTe+Cr* wherein [X varies] *lead is* from [0.60] *60* to [0.63] *63 weight percent of the lead telluride composition* and the chromium doping agent is present in an amount ranging from 0.1% to 1% by weight of the lead and tellurium.

7. A thermoelectric material having the formula [$Pb_xTe_{1-x}Cr$] *PbTe+Cr as a dopant* wherein [X varies] lead is from [0.60] *60* to [0.63] *63 weight percent of the lead telluride composition.*

8. A thermoelectric material having the formula [$Pb_xTe_{1-x}Cr$] *PbTe+Cr* wherein [X varies] *lead is* from [0.60] *60* to [0.63] *63 weight percent of the lead telluride composition* and the chromium constitutes from 0.1% to 1%, by weight, of the lead and tellurium.

References Cited

The following references, cited by the Examiner, are of record in the patented file of this patent or the original patent.

UNITED STATES PATENTS 3,268,330 8/1966 Kendall et al. ------ 252—62.3

FOREIGN PATENTS 765,884 1/1957 Great Britain.

ALLEN B. CURTIS, Primary Examiner